(12) United States Patent
Tsukada

(10) Patent No.: US 7,633,820 B2
(45) Date of Patent: Dec. 15, 2009

(54) CURRENT LIMIT CIRCUIT AND SEMICONDUCTOR MEMORY DEVICE

(75) Inventor: Shuichi Tsukada, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/483,662

(22) Filed: Jul. 11, 2006

(65) Prior Publication Data

US 2007/0008795 A1   Jan. 11, 2007

(30) Foreign Application Priority Data

Jul. 11, 2005   (JP) .............................. 2005-201157

(51) Int. Cl.
    *G11C 7/00* (2006.01)
(52) U.S. Cl. ...................... 365/203; 365/205
(58) Field of Classification Search .................. 365/203, 365/205
    See application file for complete search history.

(56) References Cited

U.S. PATENT DOCUMENTS

| | | | | |
|---|---|---|---|---|
| 4,972,373 A * | 11/1990 | Kim et al. | .................... | 365/203 |
| 5,499,211 A | 3/1996 | Kirihata et al. | | |
| 5,553,029 A * | 9/1996 | Reohr et al. | .................... | 365/208 |
| 5,602,784 A * | 2/1997 | Kojima et al. | ............ | 365/189.09 |
| 6,343,038 B1 | 1/2002 | Makino et al. | | |
| 6,781,443 B2 * | 8/2004 | Hamamoto et al. | ........... | 327/541 |
| 6,897,638 B2 * | 5/2005 | Miyanaga et al. | ............. | 323/274 |
| 6,952,091 B2 * | 10/2005 | Bansal | ......................... | 323/277 |
| 7,199,606 B2 * | 4/2007 | Tanabe | .......................... | 326/33 |
| 2003/0197551 A1 * | 10/2003 | Hamamoto et al. | ........... | 327/540 |
| 2005/0132131 A1 * | 6/2005 | David | ........................ | 711/105 |

FOREIGN PATENT DOCUMENTS

JP   3280223   2/2002

OTHER PUBLICATIONS

Korean Office Action issued in Corresponding Korean Patent Application No. 10-2006-0065009, dated on Aug. 27, 2007.
Korean Office Action, with Japanese Translation, issued in Korean Patent Application No. KR 10-2006-0065009, dated on Feb. 11, 2008.
Taiwanese Notification of Reasons for Refusal, w/ Japanese translation thereof, issued in Taiwanese Patent Application No. 095124299 dated on Oct. 31, 2008.
Chinese Notification of Reasons for Refusal, w/ Japanese translation thereof, issued in Chinese Patent Application No. CN 2006101019091 dated on Sep. 12, 2008.
German Office Action, issued in German Patent Application No. 102006031862.5 dated on Nov. 25, 2008.

* cited by examiner

*Primary Examiner*—Michael T Tran
(74) *Attorney, Agent, or Firm*—McDermott WIll & Emery LLP

(57) ABSTRACT

A current limit circuit comprising: a current limit element for limiting an output current level to within a predetermined range of a limiting current and including a first PMOS transistor having a source to which a predetermined voltage is applied and a drain through which the output current is supplied; and a gate voltage generating circuit for generating a gate voltage by a feedback control such that a difference between the predetermined voltage and a gate voltage of the first PMOS transistor coincides with a threshold voltage of a second PMOS transistor having approximately the same characteristic as that of the first PMOS transistor in a state in which a predetermined current is flowing through the second PMOS transistor.

13 Claims, 11 Drawing Sheets

CURRENT LIMIT CIRCUIT AND SEMICONDUCTOR MEMORY DEVICE

BACKGROUND OF THE INVENTION

1. Field of the Invention

This invention relates to a semiconductor memory device having a configuration for suppressing an increase in a leakage current caused by a short circuit fault between a bit line and a word line.

2. Related Art

In general DRAM, it is particularly desired to reduce current flowing when the DRAM is in standby mode. One problem arising in the DRAM in standby mode is an increase in leakage current caused by a short circuit fault between a bit line and a word line. It is general to adopt a configuration provided with redundancy cells to rectify faults occurring in normal memory cells in the conventional DRAM. By such a configuration, it is possible to replace faulty cells each of which has the short circuit fault occurring between the bit line and the word line with the redundancy cells. However, even when the faulty cells changes to non-faulty cells by replacing with the redundancy cells, the leakage current caused by the short circuit fault between the bit line and the word line still flows in standby mode, and is a cause of decreasing the yield.

A method has been proposed for reducing the leakage current caused by the short circuit fault between the bit line and the word line as described above (for example, see JP 3280223). FIG. 10 shows an example of a circuit configuration of DRAM adopting such a method. In the circuit configuration as shown in FIG. 10, an equalizing circuit 50 connected to bit line pair BLT and BLN, and a current limit element 51 which limits the current flowing from a bit line pre-charge voltage VHB to the equalizing circuit 50 are provided. The equalizing circuit 50 includes three NMOS transistors each having a gate to which a control signal EQ is applied. The current limit element 51 includes a PMOS transistor TP10 having a drain connected to node N10 of the equalizing circuit 50.

The PMOS transistor TP10 has a source to which the bit line pre-charge voltage VHB is applied and a gate to which a constant voltage V0 is applied. Further, a back bias voltage VPP is applied to an N-well in which the PMOS transistor TP10 is formed. In such a state, when equalizing operation is performed in the equalizing circuit 50, the current flowing into the bit line pair BLT and BLN through the equalizing circuit 50 is limited by the current flowing through the PMOS transistor TP10. By setting the voltage V0 properly, even when the short circuit fault occurs between the bit line and the word line, it is possible to set a desired limiting current corresponding to characteristics of the PMOS transistor TP10.

However, in the configuration of FIG. 10, when the constant voltage V0 is applied to the gate of the PMOS transistor TP10, it becomes a problem that the limiting current fluctuates with changes in the threshold voltage of the PMOS transistor TP10. FIG. 11 shows an example of subthreshold characteristics of the PMOS transistor TP10 of FIG. 10. In FIG. 11, a graph shows the relationship between the gate-source voltage VGS and the drain current IDS in the PMOS transistor TP10. Since the drain current IDS fluctuates exponentially in a threshold region, the logarithm of the absolute value |IDS| is plotted on the vertical axis. In this case, it is understood that |IDS| changes by about one digit when VGS changes by 0.1V. Herein, the threshold voltage Vtp of the PMOS transistor is defined as VGS when |IDS| is 1.0 μA. Generally, the threshold voltage Vtp of the PMOS transistor changes by about 0.2 V with a temperature fluctuation of 100° C., and further changes with fluctuations in manufacturing.

In FIG. 11, three different characteristics C1, C2 and C3 are compared with each other, taking the fluctuation of threshold voltage Vtp into consideration. The characteristic C1 corresponding to Vtp=−1.0 V to be used as a basis shifts to the characteristic C2 in the case that the absolute value of Vtp decreases (Vtp=−0.9 V), and shifts to the characteristic C3 in the case that the absolute value of Vtp increases (Vtp=−1.1 V). As shown in FIG. 11, |IDS|=1.0 μA is satisfied in the characteristic C1 (operation point A1) on condition that VGS=−1.0 V. For example, in the circuit configuration of FIG. 10, settings of VHB=0.6 V and V0=−0.4 V are assumed. Then, using the operation point A1 of the characteristic C1 to be used as a basis, if changes in the above-described threshold voltage Vtp are assumed in the PMOS transistor, |IDS|=10 μA is satisfied in the characteristic C2 (operation point A2) and |IDS|=0.1 μA is satisfied in the characteristic C3 (operation point A3), on the same condition of VGS=−1.0 V.

Thus, as a result of extremely large changes of operation points A1, A2 and A3, the limiting current set for the current limit element 51 also changes largely. In FIG. 10, even when the same voltage condition is set, it is unavoidable that the threshold voltage Vtp of the PMOS transistor TP10 changes with temperature and fluctuations in manufacturing, and it is a risk that it is made impossible to suppress the influence of the leakage current caused by the short circuit fault between the bit line and the word line.

BRIEF SUMMARY OF THE INVENTION

It is an object of the present invention to provide a semiconductor memory device with high reliability which limits current flowing through an equalizing circuit when a leakage current caused by a short circuit fault between a bit line and a word line flows in the semiconductor memory device, while maintaining the current to within a certain range of a limiting current without an influence of characteristics of the threshold voltage fluctuating due to voltage and temperature.

An aspect of the present invention is a current limit circuit comprising: a current limit element for limiting an output current level to within a predetermined range of a limiting current and including a first PMOS transistor having a source to which a predetermined voltage is applied and a drain through which said output current is supplied; and a gate voltage generating circuit for generating a gate voltage by a feedback control such that a difference between said predetermined voltage and a gate voltage of said first PMOS transistor coincides with a threshold voltage of a second PMOS transistor having approximately the same characteristic as that of said first PMOS transistor in a state in which a predetermined current is flowing through said second PMOS transistor.

According to the current limit circuit of the present invention, an output current supplied from the first PMOS transistor is limited to within a predetermined range of limiting current, and even when the threshold voltage fluctuates in the first PMOS transistor, the limiting current is kept constant by operation of the second PMOS transistor. When the threshold voltage fluctuates in the first PMOS transistor due to some cause, the threshold voltage in the second PMOS transistor having the same characteristics changes correspondingly and feedback is performed to keep the limiting current constant. Accordingly, it is possible to maintain the output current at the predetermined limiting current without an influence of the fluctuation of the threshold voltage due to temperature and fluctuations in manufacturing, and to enhance reliability of the circuit operation.

In the present invention, said gate voltage generating circuit may include a level detection circuit for detecting a voltage level at an intermediate node of a series circuit of said second transistor and a resistor and may generate said gate voltage which is controlled in accordance with a detection output of said level detection circuit.

In the present invention, said level detection circuit may include a comparator having one input terminal to which said intermediate node is connected and the other input terminal to which said predetermined voltage is applied, and said gate voltage may be applied to a drain and a gate of said second PMOS transistor, a source of said second PMOS transistor may be connected to said resistor, and a first constant voltage having a higher level than that of said predetermined voltage may be applied to said series circuit at an end of resistor side thereof.

In the present invention, said level detection circuit may include a comparator having one input terminal to which said gate voltage is applied and the other input terminal to which said intermediate node is connected, and said gate voltage may be applied to a source of said second PMOS transistor, a drain and a gate of said second PMOS transistor may be connected to said resistor, and a second constant voltage having a lower level than that of said gate voltage may be applied to said series circuit at an end of resistor side thereof.

In the present invention, said resistor may include one or more variable resistors connected in series.

An aspect of the present invention is a semiconductor memory device having a plurality of memory cells provided at intersections of a plurality of bit lines and a plurality of word lines arranged in a matrix form comprising: an equalizing circuit connected to a bit line pair being a complementary pair included in said plurality of bit lines; a current limit element for limiting a current level to within a predetermined range of a limiting current and including a first PMOS transistor having a source to which a bit line pre-charge voltage is applied and a drain through which said current is supplied to said equalizing circuit; and a gate voltage generating circuit for generating a gate voltage by a feedback control such that a difference between said bit line pre-charge voltage and a gate voltage of said first PMOS transistor coincides with a threshold voltage of a second PMOS transistor having approximately the same characteristic and process as those of said first PMOS transistor in a state in which a predetermined current is flowing through said second PMOS transistor.

According to the semiconductor memory device of the present invention, an output current supplied from a first PMOS transistor is limited to within a predetermined range of limiting current, and even when the threshold voltage fluctuates in the first PMOS transistor, the limiting current is kept constant by operation of a second PMOS transistor. In order to limit the leakage current caused by, for example, a short circuit fault between a bit line and a word line, when the threshold voltage fluctuates in the first PMOS transistor due to some cause, the threshold voltage in the second PMOS transistor having the same characteristics changes correspondingly, and feedback is performed to keep the limiting current constant. Accordingly, it is possible to maintain the current which flows through the bit line from the equalizing circuit at the predetermined limiting current without an influence of the fluctuation of the threshold voltage due to temperature and fluctuations in manufacturing, and to enhance reliability of the semiconductor memory device operation.

In the present invention, said gate voltage generating circuit may include a level detection circuit for detecting a voltage level at an intermediate node of a series circuit of said second transistor and a resistor and generates said gate voltage which is controlled in accordance with a detection output of said level detection circuit.

In the present invention, a back bias voltage is applied to an N-well in which said first PMOS transistor may be formed and to an N-well in which said second PMOS transistor is formed each with approximately the same level.

In the present invention, said gate voltage generating circuit may comprise a ring oscillator in which oscillation operation thereof is controlled in response to a detection output of said level detection circuit and a charge pump for generating said gate voltage by charge pumping operation based on an oscillation output of said ring oscillator.

In the present invention, in said gate voltage generating circuit, levels of said limiting current can be switched by a plurality of steps.

The present invention may further comprise a redundancy cell to replace with a faulty cell occurred in said plurality of memory cells, and a test operation for said memory cells may be performed by changing said levels of said limiting current by said plurality of steps, and replacement with said redundancy cell is performed based on a test result.

As described above, according to the present invention, for example, when it is necessary to limit the leakage current caused by a short circuit fault between a bit line and a word line in a semiconductor memory device, feedback control is performed using two PMOS transistors having the same characteristics. Accordingly, it is possible to realize a current limit circuit and a semiconductor memory device with high reliability, in which constant limiting current is always maintained without an influence of the characteristics of the threshold voltage fluctuating due to voltage and temperature.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

Figure 10:
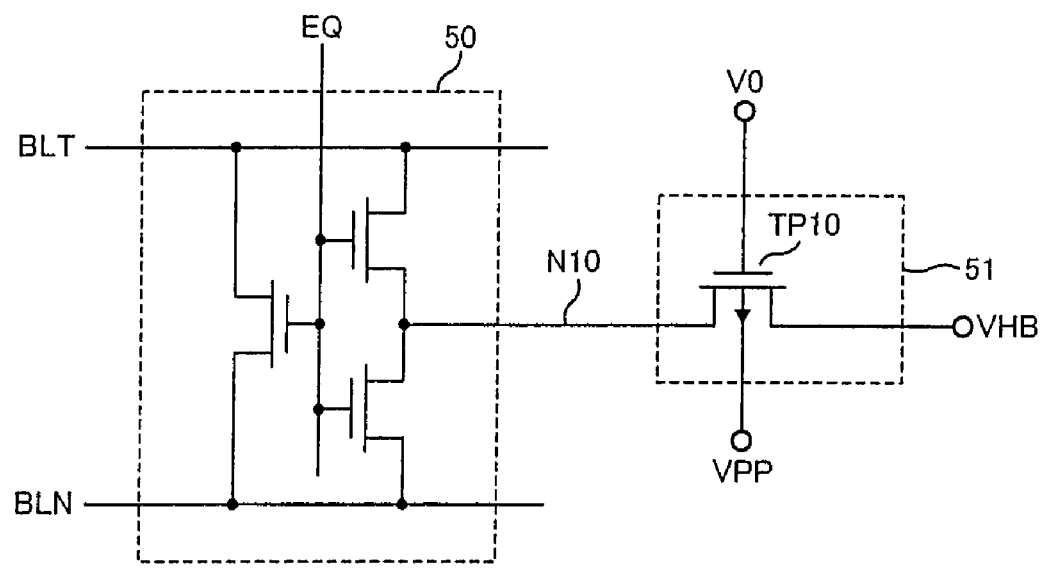
Figure 11:
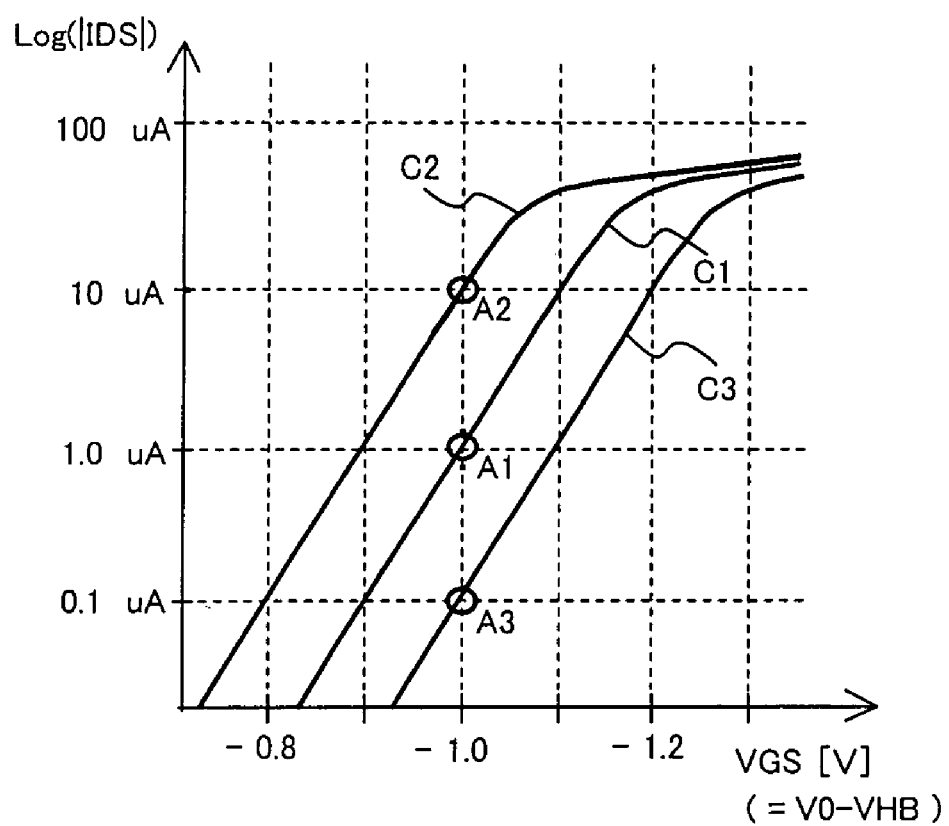

FIG. 10 is a diagram showing an example of a circuit configuration of DRAM adopting a method for reducing a leakage current caused by the short circuit fault between the bit line and the word line; and FIG. 11 is a diagram showing an example of subthreshold characteristics of a PMOS transistor TP10 of FIG. 10.

DETAILED DESCRIPTION OF THE INVENTION

An embodiment of the present invention will be described below with reference to accompanying drawings. In this embodiment, the case of applying the invention to DRAM as a semiconductor memory device is described.

Figure 1:
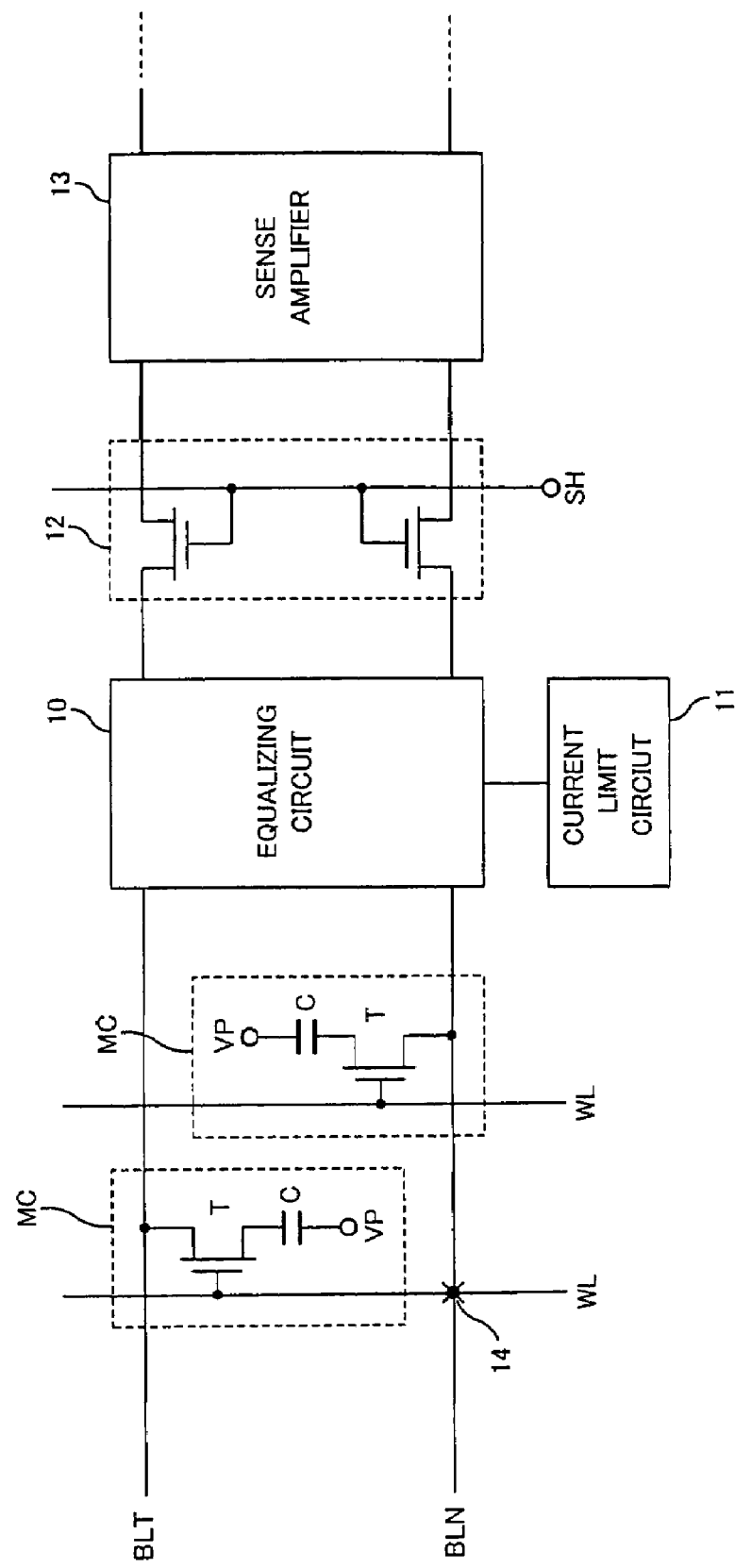
FIG. 1 a diagram showing a primary configuration of DRAM of the embodiment.

FIG. 1 is a diagram showing a primary configuration of DRAM of this embodiment. In FIG. 1, the primary configuration corresponding to bit line pair BLT and BLN as a complementary pair is shown in DRAM of this embodiment in which a plurality of bit and a plurality of word lines are arranged in matrix-form. More specifically, a circuit portion including memory cells MC, an equalizing circuit 10, a current limit circuit 11, a switch circuit 12 and a sense amplifier 13 is shown.

Each of the memory cells MC is provided at an intersection of the bit line BLT or BLN and each word line WL, and is composed of an NMOS transistor T and a capacitor C. The NMOS transistor T is connected between the bit line BLT or BLN and one electrode of the capacitor C, and the word line WL is connected to its gate. Further, a voltage VP is applied to the other electrode of the capacitor C. When a memory cell MC is selected by the word line WL, data corresponding to the accumulated charge of the capacitor C is read out to the bit line pair BLT or BLN.

The equalizing circuit 10 is a circuit which is connected to the bit line pair BLT and BLN, and is a circuit for performing pre-charge operation to equalize the potentials of the bit line pair BLT and BLN and to maintain the potentials at a reference potential corresponding to the operation state of the DRAM. The current limit circuit 11 is a circuit for limiting level of the current flowing through the bit line pair BLT and BLN from the equalizing circuit 10 to within a predetermined range of the limiting current. As shown in FIG. 1, the current limit circuit 11 has a function of suppressing an increase in the leakage current when the short circuit fault 14 occurs between the bit line BLT or BLN and the word line WL. Configurations of the equalizing circuit 10 and the current limit circuit 11 will be described later in detail.

The switch circuit 12 is a circuit for switching connections between the bit line pair BLT and BLN and the sense amplifier 13. The switch circuit 12 is composed of two NMOS transistors connected respectively to the bit line BLT or BLN, and a control signal SH is applied to both their gates. The configuration of FIG. 1 is based on the so-called shared sense amplifier system, and the sense amplifier 13 and the bit line pair BLT and BLN are controlled to be connected or disconnected in response to the control signal SH. The sense amplifier 13 detects and amplifies a minute potential difference generated between the bit line pair BLT and BLN. It is thereby possible to read out the data of an arbitrary memory cell MC selected by the word line WL.

In addition, in the configuration corresponding to the shared sense amplifier system, while omitting in FIG. 1, it is general to provide the switch circuit 12 and the equalizing circuit 10 not only at the left side but also at the right side of the sense amplifier 13 in a symmetric arrangement. Then, the switch circuit 12 is controlled so that the bit line pair BLT and BLN is connected to the right side or to the left side of the sense amplifier 13 in response to the control signal SH, and read and write operations are controlled in this state.

Further, although FIG. 1 shows only a single bit line pair BLT and BLN, an entire memory array is actually configured by arranging a large number of bit line pairs BLT and BLN of FIG. 1. Generally, a redundant configuration is adopted in the memory array, and the memory array has redundancy cells to replace with faulty cells in addition to typical memory cells MC. Therefore, it is required to provide a circuit for the redundancy cells in the same configuration as in FIG. 1. For example, when read/write of a memory cell MC fails caused by the above-mentioned short circuit fault 14, the bit line pair BLT and BLN to be replaced and a corresponding circuit portion are replaced with a bit line pair BLT and BLN and a corresponding circuit portion each provided for the redundancy cells.

Figure 2:
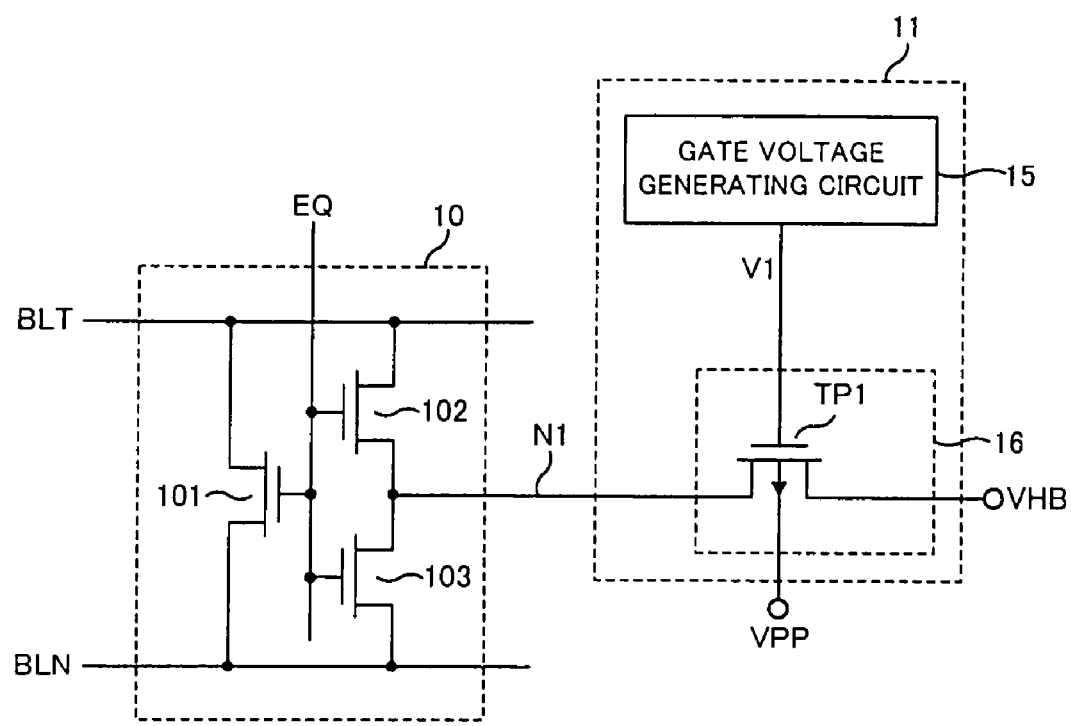
FIG. 2 a diagram showing a specific configuration of a circuit portion including an equalizing circuit and a current limit circuit in the primary configuration of FIG. 1.

Next, FIG. 2 is a diagram illustrating a specific configuration of a circuit portion including the equalizing circuit 10 and the current limit circuit 11 in the primary configuration of FIG. 1. The equalizing circuit 10 as shown in FIG. 2 is composed of three NMOS transistors 101, 102 and 103 having gates to which a control signal EQ is commonly connected. The NMOS transistor 101 is connected between one bit line BLT and the other bit line BLN. Both NMOS transistors 102 and 103 are connected at their one ends to node N1, and the other end of the NMOS transistor 102 is connected to one bit line BLT, while the other end of the NMOS transistor 103 is connected to the other bit line BLN.

In operation of the equalizing circuit 10, when the control signal EQ is high, three NMOS transistors 101 to 103 are ON and the bit line pair BLT and BLN can be pre-charged through NMOS transistors 102 and 103 by the current flowing from the current limit circuit 11 through node N1. In this state, the bit lines BLT and BLN are short circuited by the NMOS transistor 101 and are maintained at the same potential.

The current limit circuit 11 includes a current limit element 16 composed of a PMOS transistor TP1 (first PMOS transistor of the invention), and a gate voltage generating circuit 15 for generating a voltage V1 as a gate voltage supplied to the PMOS transistor TP1. In the PMOS transistor TP1, the bit line pre-charge voltage VHB is applied to the source, the voltage V1 supplied from the gate voltage generating circuit 15 is applied to the gate, and the above-mentioned node N1 is connected to the drain. Further, the back bias voltage VPP is applied to an N-well in which the PMOS transistor TP1 is formed in the DRAM.

In FIG. 2, although the single gate voltage generating circuit 15 and the single current limit element 16 are shown, a number of current limit elements 16 are connected to the single gate voltage generating circuit 15 in an actual DRAM configuration.

Current flowing into the equalizing circuit 10 through the drain of the PMOS transistor TP1 is limited to within a predetermined range of the limiting current. In this case, the level of the limiting current is adapted to the subthreshold characteristics of the PMOS transistor TP1, but as described previously, it is necessary to suppress the influence of changes in the threshold voltage Vtp of the PMOS transistor TP1. In this embodiment, it is assumed that the threshold voltage Vtp of the PMOS transistor TP1 fluctuates, and the voltage V1 is controlled properly by the operation of the gate voltage generating circuit 15. It is thereby possible to keep the limiting current constant in the PMOS transistor TP1. It will be described below that the constant limiting current can be maintained in the current limit circuit 11, based on the configuration and operation of the gate voltage generating circuit 15.

Figure 3:
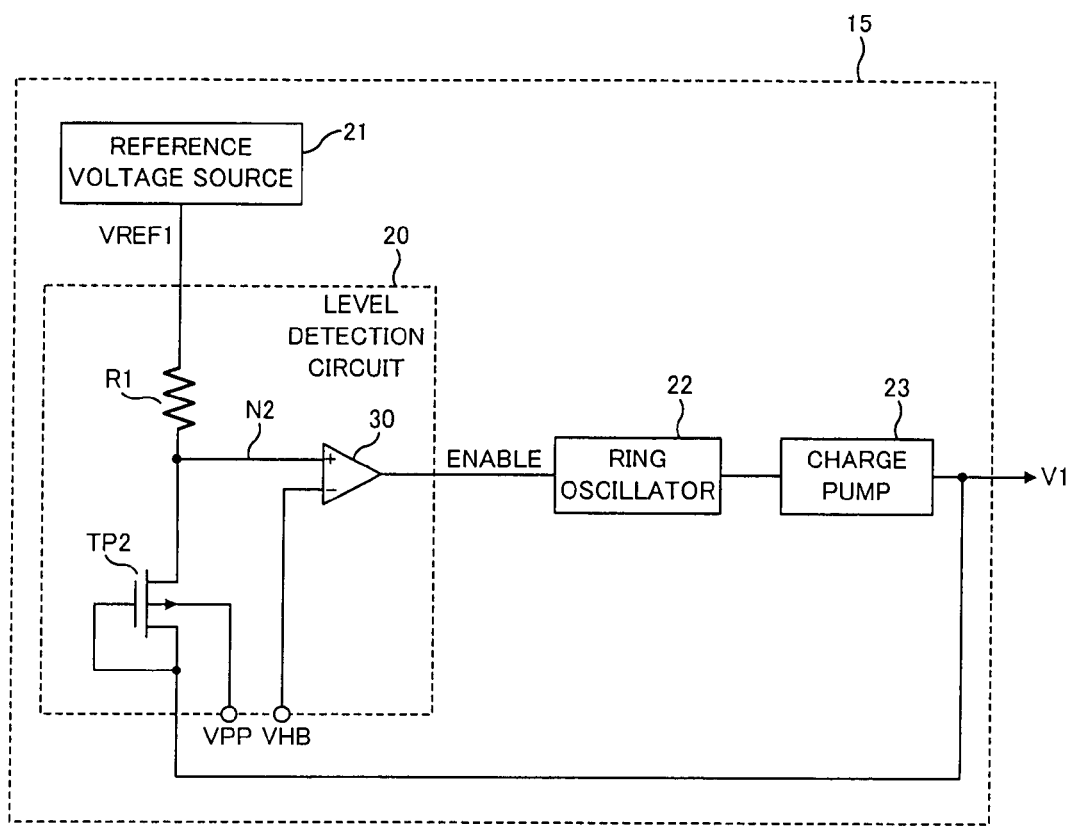
FIG. 3 is a diagram showing a configuration of a gate voltage generating circuit of a first embodiment.

A number of embodiments can be applied to configurations of the gate voltage generating circuit 15 of FIG. 2. A first embodiment of the gate voltage generating circuit 15 will be described first based on a configuration of FIG. 3. As shown in FIG. 3, the gate voltage generating circuit 15 of the first embodiment is composed of a level detection circuit 20 which detects the level of the voltage V1 determined by the relationship with a reference voltage VREF1, a reference voltage source 21 which generates the reference voltage VREF1 having a higher level than that of the bit line pre-charge voltage VHB, a ring oscillator 22 which is an oscillation circuit including multistage inverters connected in a ring shape, and a charge pump 23 which generates the voltage V1 by charge pumping operation based on an oscillation output of the ring oscillator 22.

In the above-mentioned configuration, the level detection circuit 20 is composed of a series circuit where a resistor R1 and a PMOS transistor TP2 (second PMOS transistor of the invention) are connected to each other at node N2 as an intermediate node, and a comparator 30. The resistor R1 is connected between the output side of the reference voltage source 21 and node N2. The PMOS transistor TP2 has a source connected to node N2 and short circuited drain and gate connected to the output side of the charge pump 23. The comparator 30 is connected to node N2 at its positive input terminal and the bit line pre-charge voltage VHB is applied to its negative input terminal. The back bias voltage VPP is applied to an N-well in which the PMOS transistor TP2 is formed in the DRAM.

In the level detection circuit 20, a level of a signal ENABLE which is a detection output of the comparator 30 changes corresponding to the relationship in levels between the positive and negative input terminals of the comparator 30. If the voltage level at node N2 increases and becomes higher than the bit line pre-charge voltage VHB, the signal ENABLE becomes high. Meanwhile, if the voltage level at node N2 decreases and becomes lower than the bit line pre-charge voltage VHB, the signal ENABLE becomes low. Then, when the signal ENABLE is high, the ring oscillator 22 and the charge pump 23 are activated to change the voltage V1 downward. Meanwhile, when the signal ENABLE is low, the ring oscillator 22 and the charge pump 23 are non-activated to halt operation, and the voltage V1 is changed upward by the current from the level detection circuit 20.

In the configuration of FIG. 3, representing the voltage of node N2 by V(N2), the current I1 flowing through the resistor R1 is as follows:

$$I1=(VREF1-V(N2))/R1 \quad (1)$$

Here, feedback is performed so that levels at the positive and negative input terminals of the comparator 30 are the same, and the voltage V(N2) is controlled to have the same level as that of the bit line pre-charge voltage VHB. Thus, the current I1 of eq. (1) is expressed as follows:

$$I1=(VREF-VHB)/R1 \quad (2)$$

The current I1 is approximately equal to the drain current flowing through the PMOS transistor TP2. For example, the reference voltage VREF is set to 1.6 V and the bit line pre-charge voltage VHB is set to 0.6 V.

Meanwhile, the gate-source voltage VGS of the PMOS transistor TP2 is expressed as follows:

$$VGS=V1-V(N2)=V1-VHB \quad (3)$$

As described previously, VGS in the case of |IDS|=1 μA is defined as the threshold voltage Vtp, and |IDS|=I1 is satisfied. Therefore, based on eq. (2), the resistor R1 can be set to satisfy the following equation.

$$(VREF1-VHB)/R1=1\ \mu A \quad (4)$$

In this state, since the gate-source voltage VGS in the PMOS transistor TP2 is equal to the threshold voltage Vtp, the following equation is derived from eq. (3).

$$V1=VHB+Vtp \quad (5)$$

Figure 4:
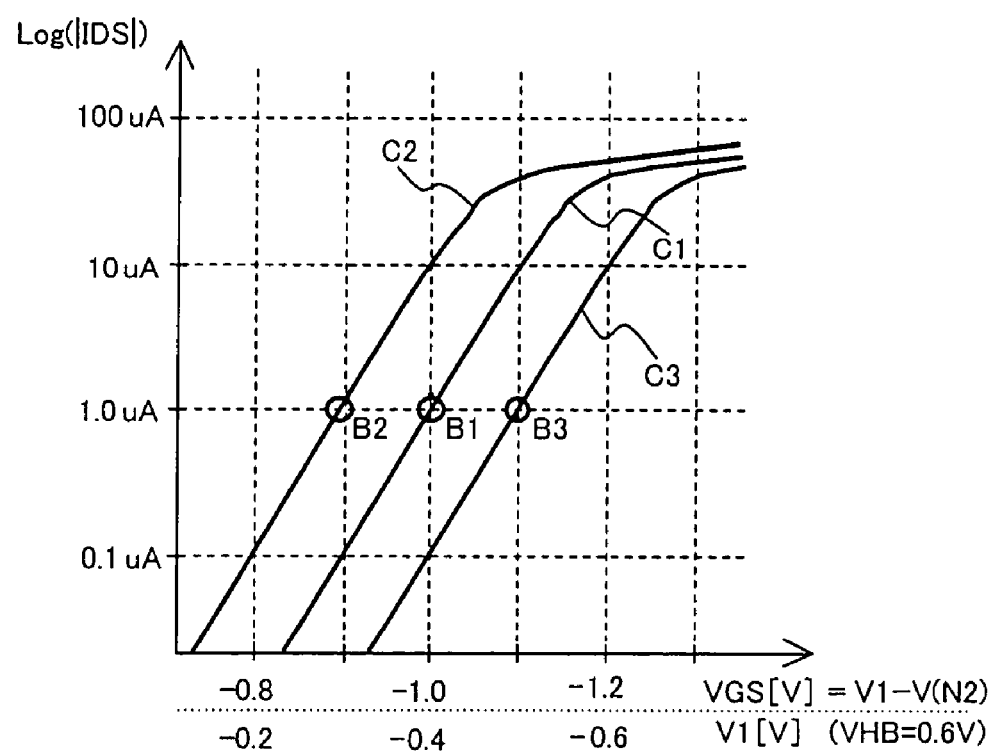
FIG. 4 is a diagram showing subthreshold characteristics of a PMOS transistor TP1 of FIG. 2 in a state where a voltage V1 is controlled based on the configuration of the gate voltage generating circuit of the first embodiment.

FIG. 4 is a graph showing the subthreshold characteristics of the PMOS transistor TP1 of FIG. 2 in a state where the voltage V1 is controlled based on the configuration of the gate voltage generating circuit 15 of the first embodiment. Herein, to compare with FIG. 11, three types of characteristics C1, C2, C3 as shown in FIG. 11 are assumed to be fluctuations in the threshold voltage Vtp, and the VHB is assumed to be set to 0.6 V. The vertical axis of the graph represents the logarithm of the absolute value |IDS|, and the horizontal axis represents both the gate-source voltage VGS and the voltage V1.

First, an operation point B1 in the characteristic C1 corresponding to Vtp=−1.0 V coincides with the operation point A1 in FIG. 11. Here, a case is considered in which the absolute value of the threshold voltage Vtp decreases starting from the operation point B1, shifting to the characteristic C2 (Vtp=−0.9 V) In this case, as distinct from FIG. 11 in which the voltage V0 is fixed, since the absolute value of the threshold voltage Vtp of the PMOS transistor TP2 decreases like the absolute value of the threshold voltage Vtp of the PMOS transistor TP1, the voltage V1 changes upward based on eq. (5). More specifically, when the threshold voltage Vtp changes to −0.9 V in the state of V1=−0.4 V, the voltage V1 increases by 0.1 V that is an increasing level (decreasing level in the absolute value) and V1=−0.3 V is satisfied, shifting to the operation point B2. As can be seen from FIG. 4, at the operation point B2, |IDS|=1.0 μA is maintained as at the operation point B1.

Next, a case is also considered in the same way in which the absolute value of the threshold voltage Vtp increases starting from the operation point B1, shifting to the characteristic C3 (Vtp=−1.1 V). That is, the absolute value of the threshold voltage Vtp of the PMOS transistor TP2 increases, and the voltage V1 thereby changes downward based on eq. (5). More specifically, when the threshold voltage Vtp changes to −1.1 V in the state of V1=−0.4 V, the voltage V1 decreases by 0.1 V that is an decreasing level (increasing level in the absolute value) and V1=−0.5 V is satisfied, shifting to the operation point B3. As can be seen from FIG. 4, at the operation point B3, |IDS|1.0 μA is maintained as at the operation points B1 and B2.

Figure 5:
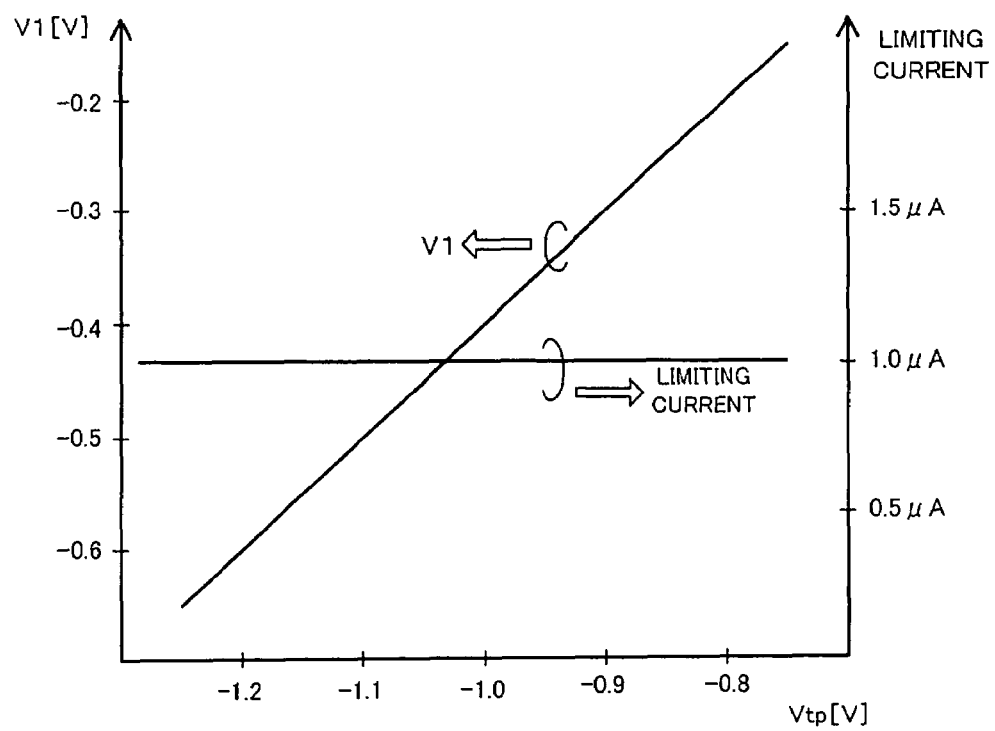
FIG. 5 is a diagram showing changes in the voltage V1 and a limiting current when a threshold voltage Vtp fluctuates in the PMOS transistor TP1.

FIG. 5 is a graph showing changes in the voltage V1 and the limiting current, in which the above-mentioned characteristics are reflected when the threshold voltage Vtp fluctuates in the PMOS transistor TP1. As shown in FIG. 5, the voltage V1 changes following the fluctuation of the threshold voltage Vtp in accordance with the operation of the gate voltage generating circuit 15. In contrast thereto, the limiting current determined by the drain current IDS is always maintained constant even when the threshold voltage Vtp fluctuates. In addition, the characteristics of FIG. 5 is an example, and by changing design conditions, it is possible to adjust values of the voltage V1 and the limiting current in FIG. 5.

Herein, if the characteristics of the PMOS transistor TP2 are different from those of the PMOS transistor TP1, it is difficult to secure the characteristics as shown in FIG. 5. Therefore, conditions such as manufacturing process and operation characteristics are required to be the same for the PMOS transistors TP1 and TP2. Accordingly, it is desirable to form the PMOS transistors TP1 and TP2 in the same manufacturing process and in the same shape and to use the back bias voltage VPP commonly, so that a configuration is realized in which the fluctuations of the threshold voltage thereof coincides with each other.

Figure 6:
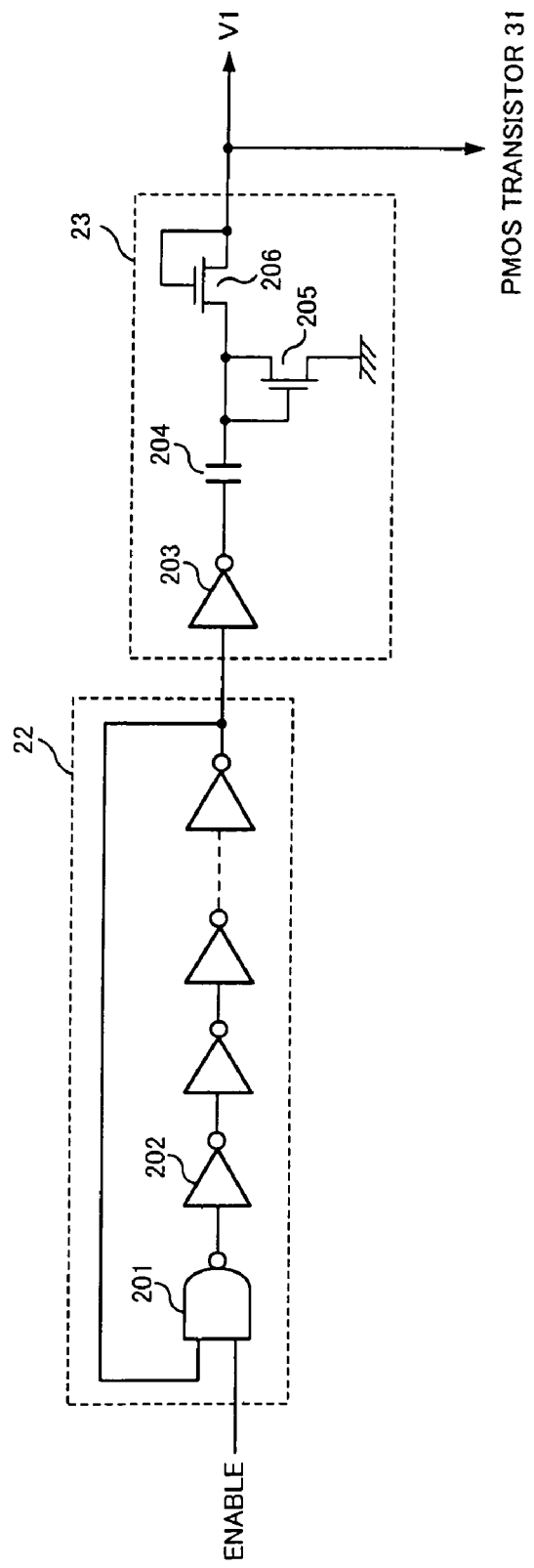
FIG. 6 is a diagram showing a specific example of a ring oscillator and a charge pump included in the gate voltage generating circuit of FIG. 3.

Next, FIG. 6 is a diagram showing a specific example of the ring oscillator 22 and the charge pump 23 included in the gate voltage generating circuit 15 of FIG. 3. The ring oscillator 22 as shown in FIG. 6 includes a single NAND circuit 201 and multistage inverters 202 connected in a ring shape. In the NAND circuit 201, the above-mentioned signal ENABLE is input to one terminal and an oscillation output of the ring oscillator 22 is fed back to the other input terminal. If the inverters 202 are connected in an even number of stages, an entire connection including the NAND circuit 201 is an odd number of stages, and self-oscillation with a predetermined frequency occurs in the ring oscillator 22. Further, it is understood that the self-oscillation in the ring oscillator 22 is enabled only when the signal EABLE is high.

The charge pump 23 as shown FIG. 6 is composed of an inverter 203, a capacitor 204, and two NMOS transistors 205 and 206. An oscillation output of the ring oscillator 22 is input to the inverter 203 of the charge pump 203, and the capacitor 204 is charged and discharged by the NMOS transistors 205 and 206. The pumping operation is performed so that the NMOS transistors 205 and 206 alternately turns ON and OFF repeatedly in response to the level of the oscillation output, and operation is performed so that the level of the voltage V1 decreases gradually.

Figure 7:
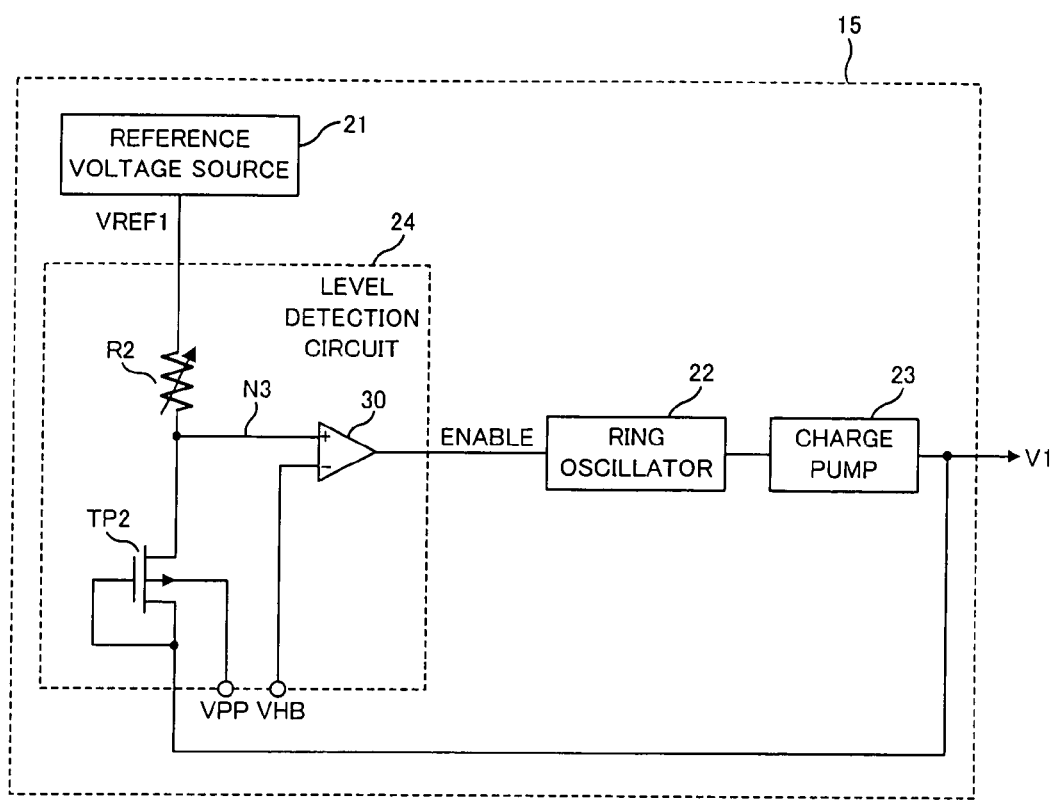
FIG. 7 is a diagram showing a configuration of the gate voltage generating circuit of a second embodiment.

Next, a second embodiment of the gate voltage generating circuit 15 will be described below based on a configuration of FIG. 7. As shown in FIG. 7, the gate voltage generating circuit 15 of the second embodiment has a basic structural elements being the same as those of the first embodiment, and descriptions thereof are omitted. Meanwhile, in the second embodiment, a level detection circuit 24 is configured by connecting a variable resistor R2 between the reference voltage source 21 and node N3, replacing with the fixed resistor R1 of the level detection circuit 20 in the first embodiment. The variable resistor R2, for example, can be formed by a plurality of fixed resistors having desired resistance values to which switching elements being turned ON and OFF by a test mode or fuses are parallel connected. In addition, the variable resistor R2 is not limited to one, but a plurality of variable resistors may be connected in series to form the resistors R2.

The configuration of the second embodiment is used in the case of changing the limiting current in the current limit circuit 11. That is, as shown in the above-mentioned eq. (1), since the drain current of the PMOS transistor TP2 increases as the variable resistor R2 decreases and decreases as the resistor R2 increases, the limiting current changes in the same way. The second embodiment is effective for the case where a plurality of tests in each of which a different level of the limiting current is switched in the test mode of DRAM or the like is performed. For example, tests are performed generally by setting a high limiting current, while being performed by setting a low limiting current when determining faults in severe conditions. Thereby, it is possible to stably determine malfunctions caused by the short circuit fault 14 and the like.

In the second embodiment, a configuration is shown in which the limiting current can be changed using the variable resistor R2, but the limiting current can be changed by other methods. For example, it is possible to switch the level of the reference voltage VREF1 in the test mode.

Figure 8:
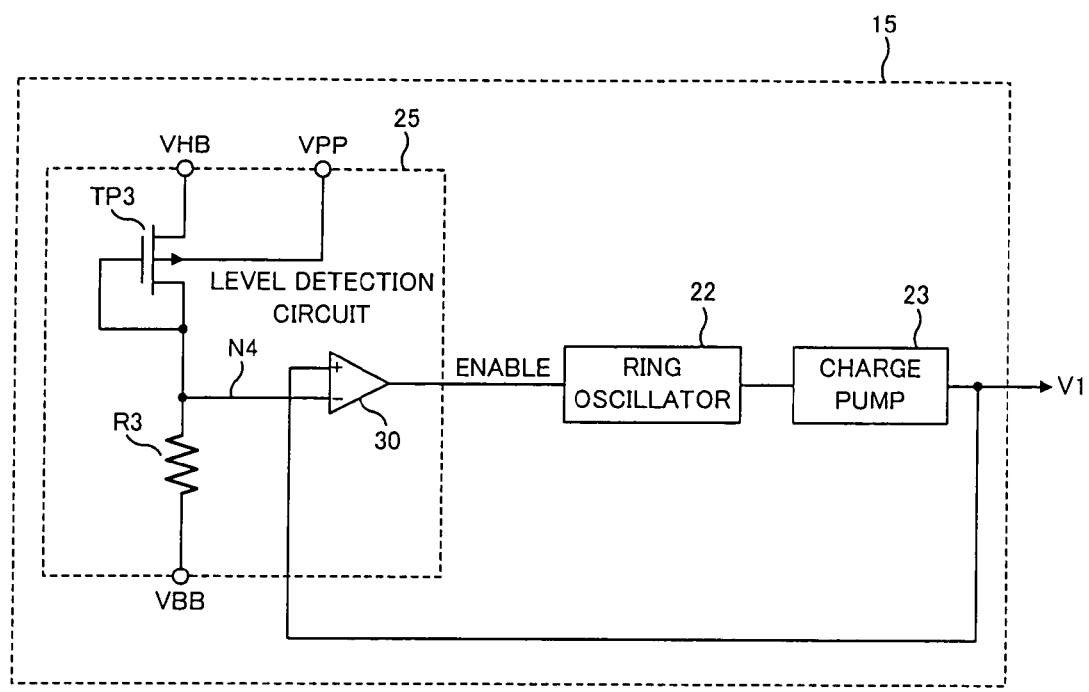
FIG. 8 is a diagram showing a configuration of the gate voltage generating circuit of a third embodiment.

Next, a third embodiment of the gate voltage generating circuit 15 will be described below based on a configuration of FIG. 8. As shown in FIG. 8, in the gate voltage generating circuit 15 of the third embodiment, a configuration of a level detection circuit 25 is different from that of the a level detection circuit 20 of the first embodiment. That is, a series circuit where a a PMOS transistor TP3 and a resistor R3 are connected to each other at node N4 as an intermediate node is formed, and the connection relationship is inverse to that of the first embodiment. The PMOS transistor TP3 has a source to which the bit line pre-charge voltage VHB is applied, and drain and gate connected to node N4. The back bias voltage VPP is applied to an N-well in which the PMOS transistor TP3 is formed. The resistor R3 is connected to node N4 at one end and a substrate power supply VBB of the DRAM is applied to the other end. The comparator 30 is connected to the output side of the charge pump 23 at its positive input terminal and is connected to node N4 at its negative input terminal. In addition, characteristics of the PMOS transistor TP3 and the comparator 30 and functions of the ring oscillator 22 and the charge pump 23 are the same in the first and third embodiments.

In the configuration of FIG. 8, representing the voltage of node N4 by V(N4), the gate-source voltage VGS of the PMOS transistor TP3 is expressed as follows:

$$VGS = V(N4) - VHB \quad (6)$$

As described above, since the voltage V(N4) is controlled to be the same level as the voltage V1 by feedback to the comparator 30, eq. (6) is expressed as follows:

$$VGS = V1 - VHB \quad (7)$$

Further, when |IDS|=1 µA is assumed, the VGS at this point is equal to the threshold voltage Vtp, and the following equation is derived from eq. (7).

$$V1 = VHB + Vtp \quad (8)$$

It is thus understood that the same result as in the first embodiment can be obtained.

Meanwhile, a current I3 flowing through the resistor R3 is expressed as follows:

$$I3 = (V1 - VBB)/R3 \quad (9)$$

The current I3 of eq. (9) changes slightly due to the fluctuation of the voltage V1 which depends on the threshold voltage Vtp. Accordingly, regarding the limiting current corresponding to the current I3, it is required to consider the slight fluctuation based on eq. (9).

Figure 9:
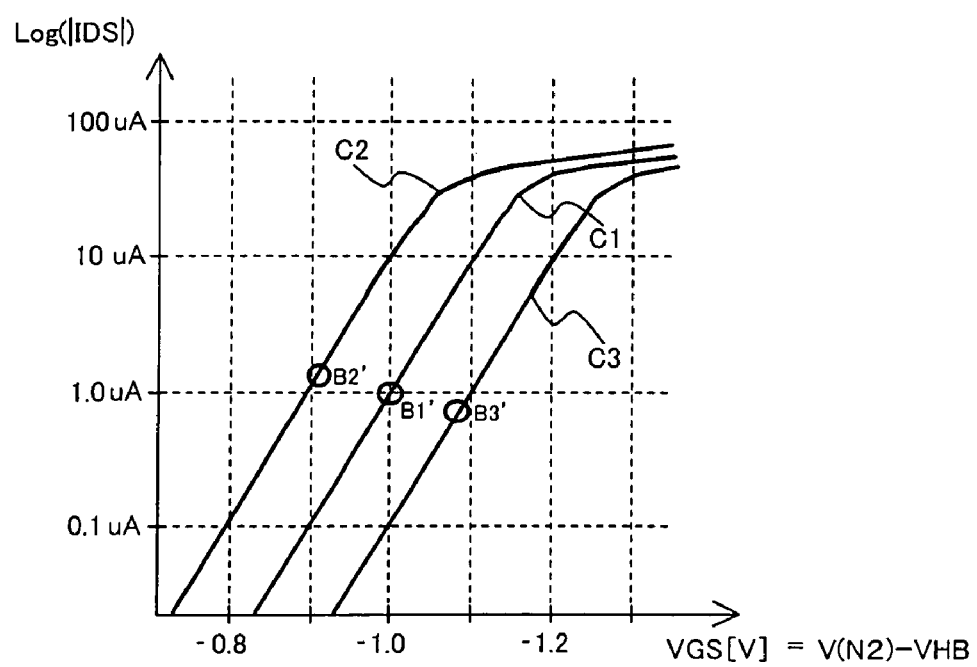
FIG. 9 is a diagram showing subthreshold characteristics of a PMOS transistor TP1 of FIG. 2 in a state where a voltage V1 is controlled based on the configuration of the gate voltage generating circuit of the third embodiment.

FIG. 9 is a graph showing subthreshold characteristics of the PMOS transistor TP1 corresponding to FIG. 4 in a state where the voltage V1 is controlled based on the configuration of the gate voltage generating circuit 15 of the third embodiment. Three types of characteristics C1, C2, C3 shown in FIG. 9 and conditions of the graph notation are the same as in FIG. 4, and descriptions thereof are omitted.

The graph of FIG. 9 is approximately the same as the graph of FIG. 4, except that three operation points B1', B2', B3' corresponding to characteristics C1, C2, C3 are slightly shifted from three operation points B1, B2, B3 in FIG. 4, respectively. This reflects that the limiting current fluctuates slightly due to the influence of the threshold voltage Vtp. However, comparing the graph of FIG. 9 with the graph of FIG. 11, changes in |IDS| are remarkably small at least as compared with three operation points A1, A2, A3 in FIG. 11, and it is understood that a sufficient effect can be obtained.

In the third embodiment, as in the second embodiment, replacing with the fixed resistor R3 in the level detection circuit 25 of FIG. 9, one or more series-connected variable resistors may be used. Also in this case, the limiting current can be changed based on adjustments of the variable resistors.

In the foregoing, the present invention is specifically described based on the embodiments, but the invention is not limited to the above-mentioned embodiments, and is capable of being carried into practice without departing from the scope of the subject matter. The embodiments describe the case of applying the invention to DRAM as a semiconductor memory device, but the invention is widely applicable to semiconductor memory devices as well as DRAM. Further, without being limited to semiconductor memory devices, the invention is widely applicable to various current limit circuits configured for the purpose of limiting an output current.

The present invention is not limited to the above described embodiments, and various variations and modifications may be possible without departing from the scope of the present invention.

This application is based on the Japanese Patent application No. 2005-201157 filed on Jul. 11, 2005, entire content of which is expressly incorporated by reference herein.

What is claimed is:

1. A current limit circuit comprising:
   a first MOS transistor to be supplied with a predetermined voltage for outputting a current having a level limited within a predetermined range; and
   a gate voltage generating circuit for supplying a gate voltage to a gate of said first MOS transistor,
   wherein said gate voltage generating circuit includes a level detection circuit for detecting a voltage level at an intermediate node of a series circuit of a second MOS transistor having approximately the same characteristic as that of said first MOS transistor and a resistor, and generates said gate voltage controlled in accordance with a detection output of said level detection circuit, and
   said level detection circuit includes a comparator having one input terminal to which said intermediate node is connected.

2. The current limit circuit according to claim 1, wherein said first and second MOS transistors are PMOS transistors.

3. The current limit circuit according to claim 1, wherein said resistor includes one or more variable resistors connected in series.

4. The current limit circuit according to claim 1, wherein said comparator has the other input terminal to which said predetermined voltage is applied.

5. The current limit circuit according to claim 4, wherein said first and second MOS transistors are PMOS transistors, and said gate voltage is applied to a drain and a gate of said second MOS transistor, a source of said second MOS transistor is connected to said resistor, and a constant voltage having a higher level than that of said predetermined voltage is applied to said series circuit at an end of a resistor side thereof.

6. The current limit circuit according to claim 1, wherein said comparator has the other input terminal to which said gate voltage is applied.

7. The current limit circuit according to claim 6, wherein said first and second MOS transistors are PMOS transistors, and said predetermined voltage is applied to a source of said second MOS transistor, a drain and a gate of said second MOS transistor are connected to said resistor.

8. A current limit circuit comprising:
   a first transistor connected between a first power supply node and a second node and having a control node receiving a control voltage; and
   a voltage generating circuit connected to said control node, including a second transistor having approximately the same characteristics as that of said first transistor, and generating said control voltage in response to a threshold voltage of said first transistor,
   wherein said gate voltage generating circuit includes a level detecting circuit including a comparator having a first input terminal connected to said second transistor.

9. The current limit circuit according to claim 8, wherein said comparator has a second input terminal connected to said first power supply node.

10. The current limit circuit according to claim 8, wherein said second transistor and a resistor connected between said control node of said first transistor and a node supplying a reference voltage in series.

11. The current limit circuit according to claim 8, wherein said comparator has a second input terminal connected to said control node of said first transistor.

12. The current limit circuit according to claim 11, wherein said second transistor and a resistor are connected between said first power supply node and a second power supply node in series.

13. The current limit circuit according to claim 8, wherein said gate voltage generating circuit includes a ring oscillator controlled in response to a detection output of said level detection circuit and a charge pump circuit generating said control voltage based on an output of said oscillator.

* * * * *